(12) United States Patent
Chen

(10) Patent No.: US 7,514,717 B2
(45) Date of Patent: Apr. 7, 2009

(54) LIGHT EMITTING DIODE

(75) Inventor: Chin-Chung Chen, Kaohsiung (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 41 days.

(21) Appl. No.: 11/686,967

(22) Filed: Mar. 16, 2007

(65) Prior Publication Data

US 2007/0164307 A1 Jul. 19, 2007

Related U.S. Application Data

(62) Division of application No. 11/161,363, filed on Aug. 1, 2005, now abandoned.

(30) Foreign Application Priority Data

Jun. 29, 2005 (TW) .............................. 94121791 A

(51) Int. Cl.
*H01L 27/15* (2006.01)

(52) U.S. Cl. ............................ 257/79; 257/98; 257/99; 257/E33.062; 257/E33.074

(58) Field of Classification Search .................. 257/98, 257/99, E33.062, E33.067, E33.074
See application file for complete search history.

(56) References Cited

U.S. PATENT DOCUMENTS 5,225,926 A * 7/1993 Cuomo et al. ............... 359/350
5,693,963 A * 12/1997 Fujimoto et al. ............. 257/94
2001/0032985 A1* 10/2001 Bhat et al. .................... 257/88
2003/0047737 A1 3/2003 Lin et al.
2004/0012980 A1* 1/2004 Sugiura et al. .............. 362/560

FOREIGN PATENT DOCUMENTS

| CN | 1571172 | | 1/2005 |
| JP | 10200162 | | 7/1998 |
| JP | 2001102675 | | 4/2001 |
| JP | 2001102675 A | * | 4/2001 |

* cited by examiner

*Primary Examiner*—Ngan Ngo
*Assistant Examiner*—Benjamin Tzu-Hung Liu
(74) *Attorney, Agent, or Firm*—Jianq Chyun IP Office

(57) ABSTRACT

A light emitting diode comprising a semiconductor layer, a first electrode, a second electrode and a diamond-like carbon layer is provided. The semiconductor layer includes a first type doped semiconductor layer, a light emitting layer and a second type doped semiconductor layer. Wherein, the light emitting layer locates between the first type doped semiconductor layer and the second type doped semiconductor layer. The first electrode is electrically connected to the first type doped semiconductor layer. The second electrode is electrically connected to the second type doped semiconductor layer. The diamond-like carbon layer covers on the semiconductor layer and exposes at least a portion of the first electrode. Moreover, the exposed outer surface of the diamond-like carbon layer is a rough surface. Alternatively, other passivation layer with rough surface can be substituted for the diamond-like carbon layer.

10 Claims, 2 Drawing Sheets

US 7,514,717 B2

LIGHT EMITTING DIODE

CROSS-REFERENCE TO RELATED APPLICATION

This application is a divisional of a prior application Ser. No. 11/161,363, filed Aug. 1, 2005, which claims the priority benefit of Taiwan application serial no. 94121791, filed on Jun. 29, 2005, and is now pending. The entirety of each of the above-mentioned patent applications is hereby incorporated by reference herein and made a part of this specification.

BACKGROUND OF THE INVENTION

1. Field of the Invention

The present invention relates to a light emitting device and a method for improving luminescence efficiency of a light emitting device. More particularly, the present invention relates to a light emitting diode (LED) and a method for improving luminescence efficiency thereof.

2. Description of Related Art

Recently, since luminescence efficiency of LEDs has been constantly upgraded, application of fluorescent lamps and/or incandescent bulbs is gradually replaced with LEDs in some areas, such as scanning light source which requires high speed response, back or front light source of a liquid crystal display (LCD), car dashboard illumination, traffic signs and general illumination devices. Compared with the traditional bulbs, LED has absolute advantages. For example, an LED is physically compact, long lasting, low voltage/current driven, durable, mercury free (pollution free) and with high emissivity (power saving) etc.

FIG. 1 is a schematic cross-sectional view showing a conventional LED. Referring to FIG. 1, the conventional LED 100 comprises a substrate 110, a semiconductor layer 120, a first electric conductive layer 130, a first electrode 140, a second electric conductive layer 150, a second electrode 160 and a passivation layer 170. The first electric conductive layer 130 is disposed on the substrate 110. The semiconductor layer 120 is disposed on the first electric conductive layer 130. The semiconductor layer 120 comprises an N-type doped semiconductor layer 122, a light emitting layer 124 and a P-type doped semiconductor layer 126 from the bottom to the top. The first electrode 140 penetrates through the region of the N-type doped semiconductor layer 122 which the light emitting layer 124 is not disposed thereon and electrically connects the first electric conductive layer 130. The second electric conductive layer 150 is disposed on the P-type doped semiconductor layer 126. The second electrode 160 is disposed on the second electric conductive layer 150. The passivation layer 170 covers on the semiconductor layer 120 and exposes at least a portion of the first electrode 140 and of the second electrode 160.

With reference to FIG. 1, when current is applied between the first electrode 140 and the second electrode 160 of the LED 100, the light emitting layer 124 will emit light when current passes. However, due to the smooth surface of the passivation layer 170, the light emitted from a light emitting layer 124 inclines producing a total reflection on the surface of the passivation layer 170. Consequently, the emissivity of the LED 100 will be reduced. Besides, SiO2 and SiNx are often used as the material of the conventional passivation layer 170, which has poor light transmission. Thus, the luminescence efficiency of the LED 100 can not be improved.

Furthermore, the heat dissipating capacity of the prior art material, such as SiO2 and SiNx, used in the passivation layer 170 is poor. In addition, the substrate 110 composed of sapphire has bad heat dissipating capacity. Therefore, not only the performance of the LED 100 is inefficient, but also the lifetime of the LED is shortened resulting from the poor heat dissipating capacity.

Therefore, how to improve the luminescence efficiency and at the same time extend the lifetime of LEDs becomes an imminent issue to be solved.

SUMMARY OF THE INVENTION

Accordingly, the object of the present invention is to provide a light emitting diode (LED) to improve luminescence efficiency and heat dissipating capacity.

Accordingly, another object of the present invention is to provide a method for improving luminescence efficiency of LEDs, which is suitable to enhance the luminescence efficiency and the heat dissipating capacity of the LEDs.

According to an embodiment of the present invention, an LED comprising a semiconductor layer, a first electrode, a second electrode and a diamond-like carbon (DLC) layer is provided. The semiconductor layer includes a first type doped semiconductor layer, a light emitting layer and a second type doped semiconductor layer. Wherein, the light emitting layer locates between the first type doped semiconductor layer and the second type doped semiconductor layer. The first electrode is electrically connected to the first type doped semiconductor layer. The second electrode is electrically connected to the second type doped semiconductor layer. The diamond-like carbon layer covers on the semiconductor layer and exposes at least a portion of the first electrode.

According to another embodiment of the present invention, an LED comprising a semiconductor layer, a first electrode, a second electrode and a passivation layer is provided. The semiconductor layer includes a first type doped semiconductor layer, a light emitting layer and a second type doped semiconductor layer. Wherein, the light emitting layer locates between the first type doped semiconductor layer and the second type doped semiconductor layer. The first electrode is electrically connected to the first type doped semiconductor layer. The second electrode is electrically connected to the second type doped semiconductor layer. The passivation layer covers on the semiconductor layer and exposes at least a portion of the first electrode. The exposed outer surface of the passivation layer is rough.

According to still another embodiment of the present invention, a method for improving luminescence efficiency of an LED is provided. First, an LED is provided. The LED at least includes a semiconductor layer, a first electrode and a second electrode. Then, a diamond-like carbon layer is formed on the LED. The diamond-like carbon layer covers on the semiconductor layer and exposes at least a portion of the first electrode.

According to still another embodiment of the present invention, a method for improving luminescence efficiency of an LED is provided. First, an LED is provided. The LED at least includes a semiconductor layer, a first electrode, a second electrode and a passivation layer. Wherein, the passivation layer covers on the semiconductor layer and exposes at least a portion of the first electrode. Then, a surface roughening step is proceeded on the passivation layer.

In conclusion, since the diamond-like carbon layer with high heat dissipating capacity is used to substitute the conventional passivation layer composed of SiO2 in the method of the present invention, the heat dissipating capacity and the lifetime of the LED can be increased. Further, by roughening the surface of the passivation layer or using the diamond-like carbon layer with higher light transmission as a passivation layer in the method of the present invention, luminescence efficiency of the LED can be enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
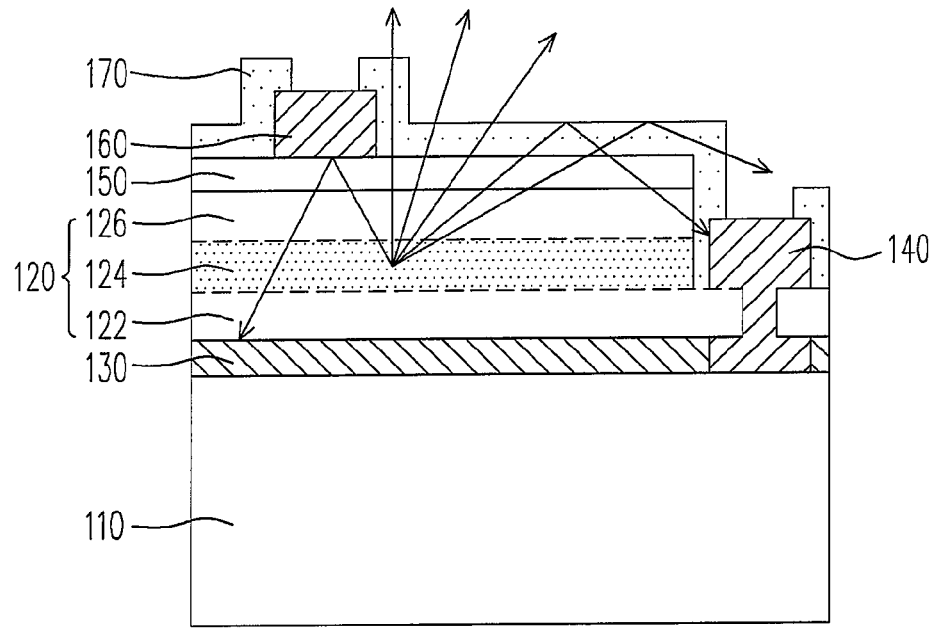
FIG. 1 is a schematic cross-sectional view showing a conventional LED.

Reference will now be made in detail to the present preferred embodiments of the invention, examples of which are illustrated in the accompanying drawings. Wherever possible, the same reference numbers are used in the drawings and the description to refer to the same or like parts.

Figure 2:
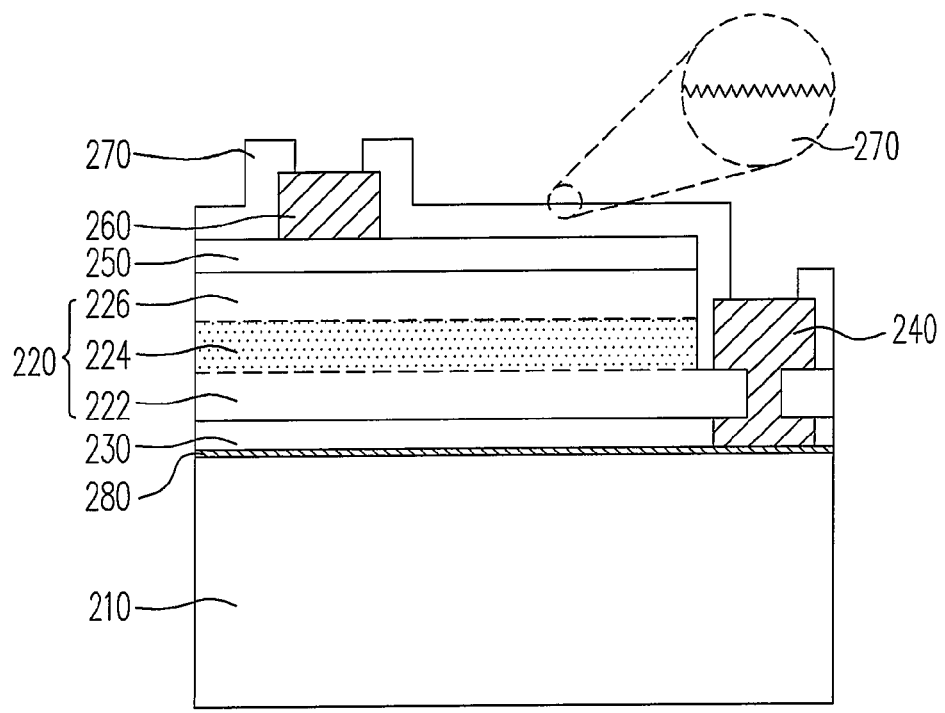
FIG. 2 is a schematic cross-sectional view showing an LED according to the first embodiment of the present invention.

FIG. 2 is a schematic cross-sectional view showing an LED according to the first embodiment of the present invention. As shown in FIG. 2, an LED 200 essentially comprises a semiconductor layer 220, a first electrode 240, a second electrode 260 and a diamond-like carbon layer 270. The semiconductor layer 220 includes a first type doped semiconductor layer 222, a light emitting layer 224 and a second type doped semiconductor layer 226. Wherein, the light emitting layer 224 locates between the first type doped semiconductor layer 222 and the second type doped semiconductor layer 226. The first electrode 240 is electrically connected to the first type doped semiconductor layer 222. The second electrode 260 is electrically connected to the second type doped semiconductor layer 226. A diamond-like carbon layer 270 covers on the semiconductor layer 220 and exposes at least portion of the first electrode 240.

Referring to FIG. 2, owing to the better light transmission of the diamond-like carbon layer 270, the luminescence efficiency of the LED 200 can be improved. In addition, the exposed outer surface of the diamond-like carbon layer 270 presents in a rough surface after a roughening process, so that the total reflection of light on the surface of the diamond-like carbon layer 270 can be reduced. Thus, the luminescence efficiency of the LED 200 can be improved thereby. Moreover, since the diamond-like carbon layer 270 has better heat dissipating capacity, the lifetime of the LED 200 can be extended. Certainly, the diamond-like carbon layer 270 can be substituted by a passivation layer composed of other commonly used material, after processed a surface roughening step, the luminescence efficiency of the LED 200 still can be improved.

In this embodiment, the LED 200 may further comprises a substrate 210. The substrate 210 is a sapphire substrate, for example. Also, the substrate 210 can be a silicon substrate or metallic substrate which has better heat dissipating capacity to improve the heat dissipating capacity of the LED 200. The first type doped semiconductor layer 222 can be disposed on the substrate 210, the light emitting layer 224 can be disposed on the partial region of the first type doped semiconductor layer 222, the second type doped semiconductor layer 226 can be disposed on the light emitting layer 224. The doping type of the first type doped semiconductor layer 222 and the second type doped semiconductor layer 226 can be an N-type or P-type doped semiconductor layer and the dope types are different to each other.

Wherein, the first electrode 240 can be disposed on the region of the first type doped semiconductor layer 222 which the light emitting layer 224 is not disposed thereon. The second electrode 260 can be disposed on the second type doped semiconductor layer 226. The diamond-like carbon layer 270 exposes at least a portion of the second electrode 260. The first electrode 240 and the second electrode 260 may compose of gold, silver, platinum or other suitable conductive material.

In addition, the LED 200 may further comprise a first electric conductive layer 230 and a second conductive layer 250. The first electric conductive layer 230 can be disposed between the substrate 210 and the first type doped semiconductor layer 222; and the first electrode 240, passing through the first type doped semiconductor 222, electrically connects to the first electric conductive layer 230. The second electric conductive layer 250 can be disposed on the second type doped semiconductor layer 226, and the second electrode 260 is disposed on the second electric conductive layer 250. Wherein, the first electric conductive layer 230 and the second conductive layer 250 may be composed of non-transparent or transparent conductive material, depending on the design of the LED 200 whether the light emission is from the top, the bottom or two sides. In addition, the transparent conductive material of the first electric conductive layer 230 and the second electric conductive 250 can increase the luminescence efficiency of the LED 200. The transparent conductive material of the first electric conductive layer 230 and the second conductive layer 250 can be indium tin oxide (ITO), indium zinc oxide (IZO) or other transparent conductive material.

Meanwhile, the surface of the second type doped semiconductor layer 226 might be roughened for enhancing the bonding strength between the second type doped semiconductor layer 226 and the second electric conductive 250. Although the second electrode 260 contacts the second type doped semiconductor layer 226 directly in FIG. 2, but the second electrode 260 could also contacts the second type doped semiconductor layer 226 directly or via the second electric conductive 250.

Moreover, if the first electric conductive layer 230 and the second conductive layer 250 are both composed of transparent conductive material, a first optic reflective layer 280 may be disposed between the substrate 210 and the first electric conductive layer 230, or a second optic reflective layer (not shown) may be disposed on the second conductive layer 250. Accordingly, the LED 200 becomes a single-sided emitting type. Wherein, the optic reflective layer may compose of gold, silver, platinum or other suitable metal with high reflectivity.

Figure 3:
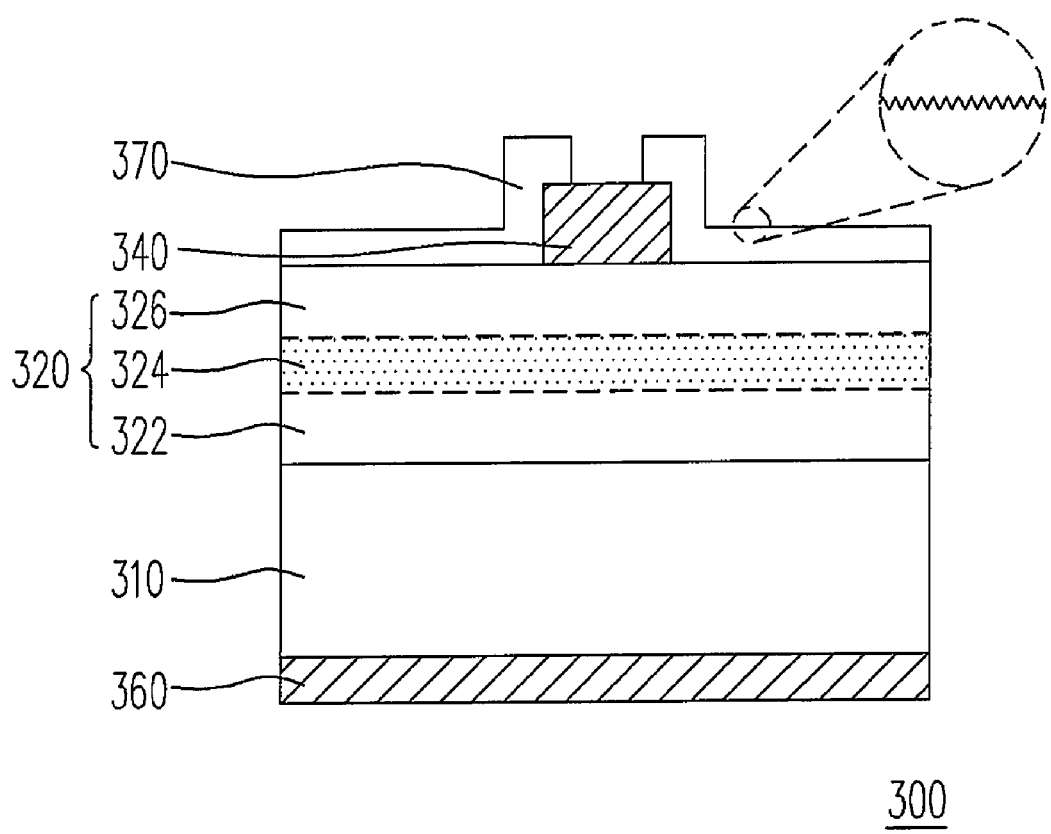
FIG. 3 is a schematic cross-sectional view showing an LED according to the second embodiment of the present invention.

FIG. 3 is a schematic cross-sectional view showing an LED according to the second embodiment of the present invention. As shown in FIG. 3, the LED 300 essentially comprises a semiconductor layer 320, a first electrode 340, a second electrode 360 and a diamond-like carbon layer 370. Wherein, the layers of the LED 300 is similar to the layers of the LED 200 shown in FIG. 2, thus details are omitted here. Meanwhile, the surface of the second type doped semiconductor layer 326 might be roughened for enhancing the bonding strength between the second type doped semiconductor layer 326 and the diamond-like carbon layer 370.

Referring to FIG. 3, owing to the better light transmission of the diamond-like carbon layer 370, the luminescence efficiency of the LED 300 can be improved. In addition, the exposed outer surface of the diamond-like carbon layer 370 can be a rough surface, so that the total reflection of light around the surface of the diamond-like carbon layer 370 can be reduced and the luminescence efficiency of the LED 300 can be improved thereby. Moreover, since the diamond-like carbon layer 370 has better heat dissipating capacity, the lifetime of the LED 300 can be extended. Certainly, the diamond-like carbon layer 370 can be substituted by a passivation layer composed of other commonly used material, after processed a surface roughening step, the luminescence efficiency of the LED 300 still can be improved.

In this embodiment, the LED 300 may further comprises a semiconductor substrate 310, which locates between a second electrode 360 and a semiconductor layer 320. When current is applied between the first electrode 340 and the second electrode 360 of the LED 300, the current will still reach the semiconductor layer 320 passing through the semiconductor substrate 310.

According to the description above, a diamond-like material passivation layer to improve luminescence efficiency of LEDs can be used to replace the conventional passivation layer which has poor light transmission. Moreover, after a passivation layer is formed, a surface roughening step can be proceeded on the passivation layer that covers on the semiconductor layer and exposes at least a portion of the electrode. The luminescence efficiency of LEDs will be improved remarkably after the diamond-like material passivation layer is proceeded with a surface roughening step. Wherein, the surface roughening step may be a reactive ion etching or other surface roughening method. While proceeding the surface roughening step to the passivation layer by reactive ion etching method, nitrogen and oxygen can be used as reactive gas if the passivation layer is composed of diamond-like material; chlorine can be used as reactive gas if the material of the passivation layer is SiO2.

In conclusion, the present invention provides an LED and a method for improving luminescence efficiency thereof by using a diamond-like carbon layer with high heat dissipating capacity to substitute the conventional passivation layer composed of SiO2. Since the heat generated by the LED can be dissipated efficiently, the lifetime of the LED can be increased. Furthermore, the method of the present invention proceeds a surface roughening step to the passivation layer or uses a diamond-like carbon layer with higher light transmission as the passivation layer, therefore the total reflection of light on the surface of the passivation layer can be avoided, and the luminescence efficiency of LEDs at the same time is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode, comprising:
   a semiconductor layer including a first type doped semiconductor layer, a light emitting layer and a second type doped semiconductor layer, wherein the light emitting layer locates between the first type doped semiconductor layer and the second type doped semiconductor layer;
   a first electrode electrically connecting to the first type doped semiconductor layer;
   a second electrode electrically connecting to the second type doped semiconductor layer; and
   a diamond-like carbon layer covering the semiconductor layer and exposes at least a portion of the first electrode, wherein an exposed outer surface of the diamond-like carbon layer is a rough surface.

2. The light emitting diode according to claim 1, further comprising a substrate, wherein the first type doped semiconductor layer is disposed on the substrate, the light emitting layer is disposed on a portion of the first type doped semiconductor layer, the second type doped semiconductor layer is disposed on the light emitting layer, the first electrode is disposed on the region of the first type doped semiconductor layer which the light emitting layer is not disposed thereon, the second electrode is disposed on the second type doped semiconductor layer, and part of the second electrode is further exposed by the diamond-like carbon layer.

3. The light emitting diode according to claim 2, further comprising a first electric conductive layer disposing between the substrate and the first type doped semiconductor layer, and the first electrode electrically connects to the first electric conductive layer passing through the first type doped semiconductor layer.

4. The light emitting diode according to claim 3, wherein the material of the first electric conductive layer includes transparent conductive material.

5. The light emitting diode according to claim 3, further comprising a first optic reflective layer disposing between the substrate and the first electric conductive layer.

6. The light emitting diode according to claim 2, further comprising a second electric conductive layer disposing on the second type doped semiconductor layer, and the second electrode is disposed on the second electric conductive layer.

7. The light emitting diode according to claim 6, wherein the material of the second electric conductive layer includes transparent conductive material.

8. The light emitting diode according to claim 6, further comprising a second optic reflective layer disposing on the second electric conductive layer, and the second electrode is disposed on the second optic reflective layer.

9. The light emitting diode according to claim 2, wherein the substrate includes silicon substrate or metallic substrate.

10. The light emitting diode according to claim 1, further comprising a semiconductor substrate disposing between the second electrode and the semiconductor layer.

* * * * *